United States Patent [19]

Kanber et al.

[11] Patent Number: 4,876,211

[45] Date of Patent: Oct. 24, 1989

[54] METHOD FOR FABRICATING VARACTOR DIODES USING ION IMPLANATION

[75] Inventors: Hilda Kanber, Rolling Hills Estates; James C. Chen, Torrance, both of Calif.

[73] Assignee: Hughes Aircraft Company, Los Angeles, Calif.

[21] Appl. No.: 230,093

[22] Filed: Aug. 9, 1988

[51] Int. Cl.$^4$ .............................................. H01L 29/93
[52] U.S. Cl. ........................................ 437/22; 437/26; 357/14
[58] Field of Search ...................... 357/14; 437/22, 27, 437/28, 30, 919, 26

[56] References Cited

U.S. PATENT DOCUMENTS

| | | | |
|---|---|---|---|
| 4,106,953 | 8/1978 | Onodera | 357/14 |
| 4,438,445 | 3/1984 | Colquhoun et al. | 357/14 |

FOREIGN PATENT DOCUMENTS

| | | | |
|---|---|---|---|
| 50-31795 | 10/1975 | Japan | 357/14 |
| 53-13370 | 2/1978 | Japan | 357/14 |
| 53-144277 | 12/1978 | Japan | 357/14 |
| 55-156373 | 12/1980 | Japan | 437/919 |

OTHER PUBLICATIONS

Hara et al., IEEE Transact. Consumer Electronics, V. CE-26 (Nov. 1980), pp. 729'733.
Ghandhi, *VLSI Fabrication Principles* John Wiley and Sons, Inc., New York, N.Y., pp. 333-337 (1983).

*Primary Examiner*—Olik Chaudhuri
*Attorney, Agent, or Firm*—Terje Gudmestad; A. W. Karambelas

[57] ABSTRACT

A process for fabricating varactor diodes using ion implantation techniques is described herein. Three successive implanations of N-type ions into a GaAs semi-insulating substrate provide a deep N+ type conductivity layer about 2-3 microns below the front major surface with concentration of at least $2 \times 10^{18}$ ions/cm$^3$. A fourth implantation of N type ions forms an N type conductivity layer over the N+ layer. An implanation of P type ions forms the P type conductivity layer over the N type conducitivity layer. A single rapid thermal anneal is performed on the substrate to remove damage to the crystal structure and to electrically activate the implants. The basic doped layered semiconductor structure is thereby produced using ion implantation. This ion implantation process provides a method for fabricating monolithic diode devices reliably and in mass quantities, which can be integrated with other monolithic devices.

17 Claims, 2 Drawing Sheets

METHOD FOR FABRICATING VARACTOR DIODES USING ION IMPLANATION

BACKGROUND OF THE INVENTION

The Government has rights in this invention pursuant to Contract No. F33615-86-C-1069 awarded by the Department of the Air Force.

1. Field of the Invention

This invention relates generally to varactor diodes and more particularly to techniques for producing varactor diodes using ion implantation and rapid thermal annealing.

2. Description of Related Art

For the past several years, varactor diodes have been used as tuning elements in oscillators, as multiplication elements in harmonic generators or multipliers, or as impedance control elements in analog and digital phase shifters at microwave or millimeter wave frequencies. Varactor diodes are semiconductor devices also known as variable-capacitance diodes or voltage variable capacitors. In varactor diodes, the barrier capacitance is not constant but varies with the voltage applied to the device and hence gives it these various names. The larger the reverse voltage applied to the diode, the larger the space charge width within the diode and the smaller the capacitance. For example, as impedance control elements in variable phase shifters, the voltage is varied to change the capacitance of the diode and hence the impedance thereby effecting a phase shift change.

In order to achieve the voltage sensitive capacitance characteristic of a varactor diode, the semiconductor layers of the diode must have the appropriate doping profiles including a buried N+ layer 2.5 to 5 microns deep below the front surface of the device substrate with a peak concentration of $2 \times 10^{18}$ ions/cm$^3$, for example. Currently, vapor phase epitaxy is being used to build the various doped semiconductor layers of the varactor diode with the appropriate doping profiles. In this process, the layers of the diode are grown one by one until the varactor semiconductor structure is completed. The various doped layers grown by vapor phase epitaxy process, however, are highly nonuniform in thickness and doping, and therefore vapor phase epitaxy is not the most desirable method for fabricating high output, mass produced varactor diodes.

Furthermore, epitaxially fabricated varactor diodes are not monolithic, and therefore cannot be fabricated on the same substrate with other semiconductor devices such as field effect transistors (FETs), mixer diodes and PIN diodes, for example. Instead, epitaxially fabricated varactors must be used with other semiconductor devices or other electrical components in hybrids or tuned waveguide cavities. Parasitic circuit elements associated with hybrid device packaging and mounting always hampers the tuning efficiency of the varactor to the external circuit. Waveguide cavities on the other hand are expensive, heavy in weight, large in size and involve time-consuming labor assembly procedures. The ability to manufacture varactor diode devices on the same wafer with other semiconductor devices would eliminate external connections between such devices thereby increasing packaging density of the electrical components and reducing the overall weight of the circuit. Minimizing size and weight are important in airborne communication systems and space-based radar, as well as ground based electronic systems. Furthermore, if varactors and other semiconductor devices could be fabricated on the same wafer it would allow the components to be as close together as possible in the microwave operating region thereby preventing limitations on device performance due to parasitic elements.

Ion implantation techniques have developed for fabricating GaAs FET devices, a prime example being disclosed in U.S. Pat. No. 4,473,939 issued to the same assignee herein. However, although ion implantation has been a technique for fabricating semiconductor devices for more than twenty years and although it has been suggested that varactors could be manufactured by ion implantation, no technique for fabricating varactors with the desired highly doped, deeply buried N+ type conductivity layers has been realized. Accordingly, a method of fabricating a monolithic varactor diode using ion implantation would therefore greatly advance the art.

SUMMARY OF THE INVENTION

It is therefore an object of the present invention to provide a method of fabricating varactor diodes by ion implantation.

It is an additional object of this invention to provide a high yield method for manufacturing varactors having thicknesses that are more uniform than was achievable by prior art methods.

It is a further object of the present invention to provide a technique for large scale production of varactor diodes suitable for monolithic integrated circuits.

A method for manufacturing varactor diodes according to the present invention includes providing a semi-insulating substrate. In successive ion implantation steps, silicon ions and sulfur ions are implanted into the semi-insulating substrate to a depth of 2 to 5 microns and a concentration of $2 \times 10^{18}$ ions/cm$^3$ to form an N+ type conductivity layer. Silicon ions are again implanted to form an N type conductivity layer over the N+ layer. For the last implantation, beryllium ions are implanted above the N type conductivity layer to form a shallow P+ type conductivity layer over the N layer and adjacent to the surface of the original substrate. A rapid thermal anneal is employed to activate all of the implants. Therefore, by low cost implantation techniques, the basic layered structure for a varactor diode may be formed which is uniform and reproducible.

Other and further objects, advantages and characteristic features of the present invention will become readily apparent from the following description of the preferred embodiment of the invention when taken in conjunction with the accompanying drawings.

DETAILED DESCRIPTION OF THE INVENTION

Figure 1A:
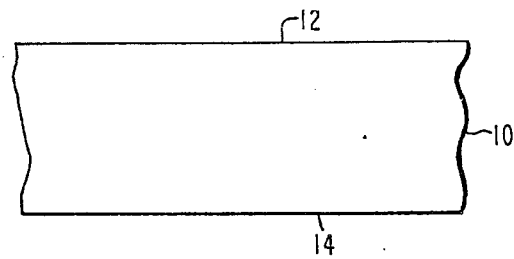
FIGS. 1a through 1, illustrates a preferred process sequence according to the present invention for fabricating varactor diodes.
Figure 1B:
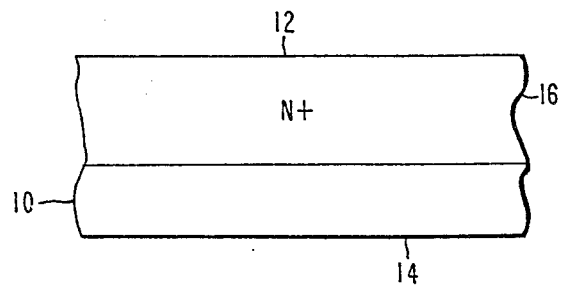

Referring now to FIGS. 1a through 1h, there is shown in FIG. 1a a semi-insulating gallium arsenide (GaAs) substrate 10 having front and back essentially parallel major surfaces 12 and 14. Other III-V semiconductor materials may also be used such as indium phosphite (InP), for example. An N+ type conductivity layer 16 (hereinafter N+ layer) is formed between the front and back major surfaces 12 and 14 of the semi-insulating substrate 10 by conventional ion implantation techniques using N type ions, as shown in FIG. 1b. The preferred method for forming the N+ layer 16 involves three ion implantation steps.

First, silicon ions are implanted through the front major surface 12 at an energy level of from about 5 MeV to about 6 MeV, and a dose between $1\times10^{14}$ ions/cm$^2$ to about $1\times10^{15}$ ions/cm$^2$. Thereafter, a second implantation of silicon ions is made at an energy level of from about 3 MeV to about 5MeV, and a dose between $1\times10^{13}$ ions/cm$^2$ to about $1\times10^{15}$ ions/cm$^2$. Third, sulfur ions are implanted at an energy level of from about 5 MeV to about 7 MeV and a dose between about $1\times10^{14}$ ions/cm$^2$ to about $1\times10^{15}$ ions/cm$^2$. The three ion implantation steps form a deep N+ layer about 2-3 microns below the top major surface 12 of the substrate 10 having a peak concentration greater than $2\times10^{18}$ ions/cm$^3$, which is desired for varactor diodes. These ion implantations may be performed blanketly over the entire substrate or selectively into preselected areas of the substrate leaving open areas on the substrate where other millimeter or microwave monolithic-type devices such as FETs (field effect transistors) may be manufactured.

Figure 1C:
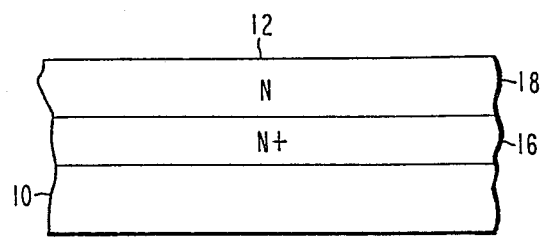
Figure 1D:
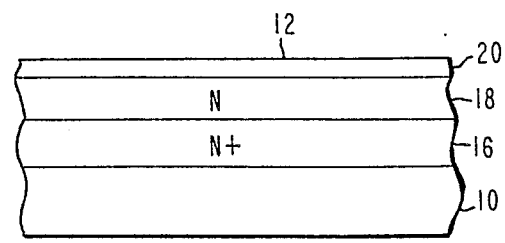

As shown in FIG. 1c, an N-type conductivity layer 18 (hereinafter N layer) is formed over the N+ layer 16, by ion implanting silicon ions through the front major surface 12 from about 350 KeV to about 500 KeV at a dose between about $6\times10^{12}$ ions/cm$^2$ to $1\times10^{13}$ ions/cm$^2$. Next, the substrate 10 is subjected to an implantation of P type ions such as beryllium ions through the front major surface 12 from about 5 KeV to 25 KeV and a dose between about $5\times10^{14}$ ions/cm$^2$ to $5\times10^{15}$ ions/cm$^2$ which forms the top P+ type conductivity layer 20 (hereinafter P+ layer) as shown in FIG. 1d. The transition between the P+ layer 20 and the N type conductivity layer 18 is preferably very abrupt, the P+ layer preferably extending not deeper than 3000Å into the substrate. The concentration range of the P+ layer should be about $1\times10^{18}$ to about b $1\times10^{19}$ ions/cm$^3$, but preferably as close to $1\times10^{19}$ ions/cm$^3$ as possible.

After completion of the ion implantation steps above, the layered structure fabricated thus far is placed in an annealing furnace (not shown) wherein the substrate 10 is heated to a temperature between 900° to 1050° C. for about 5 to 20 seconds in a high purity atmosphere of either argon, hydrogen or helium, for example. This single anneal step activates all the implants by removing lattice damage and increasing electrical activity in the ion implanted regions.

Figure 1E:
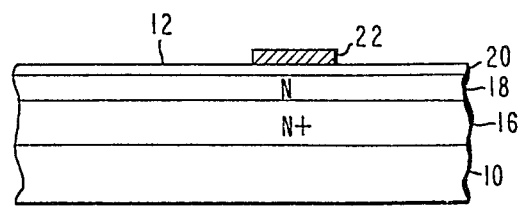

Once the basic semiconductor layered structure is formed, the ohmic contact to the P+ layer 20 is fabricated as shown in FIG. 1e. A layer of photoresist (not shown) is deposited on the front major surface 12 and exposed using techniques well-known in the art to form the desired pattern for contacts to the P+ layer 20. If a plurality of varactor diodes are to be formed on the same substrate, the desired contact pattern for the various varactor diodes may be patterned onto the front major surface, which may be a patterned opening for a plurality of finger contacts, for example. A metal alloy, such as palladium, tin, palladium and gold, or gold and zinc may be deposited over the front major surface by E-beam evaporation, for example, or other deposition techniques well-known in the art forming the P+ layer contact 22 as shown in FIG. 1e. After the deposition of the metal, the photoresist and excess metal are lifted off.

Figure 1F:
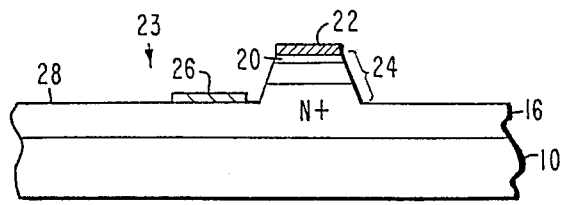

Once the P+ layer contact 22 is formed, another photoresist pattern (not shown) is applied over the front major surface 12 of the substrate 10 and P+ layer contact 22 and exposed so that only the P+ layer contact 22 is covered with photoresist. Using a chemical etchant, such as sulfuric acid, for example, the exposed P+ and N layers, and a portion of the N+ layer 16 are successively etched away forming a mesa of N+, N and P+ doped semiconductor material 24 topped by the P+ layer contact 22 as shown in FIG. 1f. The N+ layer 16 is preferably etched down to the point of highest doping concentration so that metallic contacts subsequently formed on the N+ layer will have the lowest contact resistance therebetween.

In the next step, another photoresist layer (not shown) is deposited over the front surface 23 of the substrate 10, and exposed to form patterned openings for the N+ layer contacts, which may be a single contact pattern or a finger pattern interdigitatedly disposed with respect to the P+ layer contact, for example. Metal is deposited into the open areas of the photoresist by E-beam evaporation, for example, forming N+ layer contact 26 as shown in FIG. 1f. The metal so deposited may be eutectic gold and germanium, or a metal alloy of gold, germanium, nickel and gold. Once the P+ layer contact 22 and N+ layer contact 26 metallizations have been deposited they are alloyed into their surfaces 12 and 28, respectively, by heating the substrate to a temperature of about 400° C. for about one minute, for example.

Figure 1G:
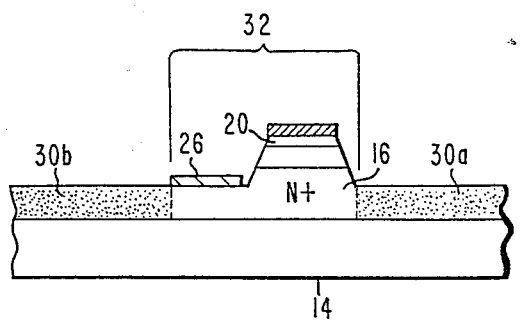

In order to electrically isolate the various devices (varactors or FETs, for example) that may be formed on the substrate 10, conversion regions 30a and 30b are produced in the N+ layer by a carefully controlled high energy proton bombardment of the structure as shown in FIG. 1g. This bombardment damages the crystalline atomic structure of prescribed N+ layer regions, thereby converting the bombarded regions of the conductive N+ layer region 16 into nonconductive regions 30a and 30b. Proton bombardment parameters are selected to ensure that the protons penetrate to the bottom of the N+ layer 16; otherwise, a thin conductive layer would remain, creating a significant stray capacitance which would limit the frequency cutoff and the bandwidth of the resulting diode. A suitable photoresist mask, (not shown) defines the lateral extent of the conversion regions and protects the diode region 32 against the bombardment, which may employ multiple proton implantations with energy levels of about 400 KeV to 50 KeV, for example.

Figure 1H:
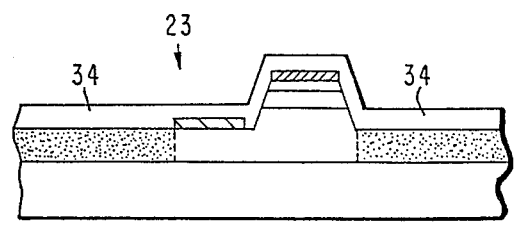

After the active areas of various devices that may be formed on the substrate have been electrically isolated, an insulator layer 34 made of dielectric material such as silicon nitride (Si$_3$N$_4$) is deposited over the diode to a thickness of about 2000Å, for example, as shown in FIG. 1h. The insulator layer 34 also serves to passivate the diode structure.

Figure 1I:
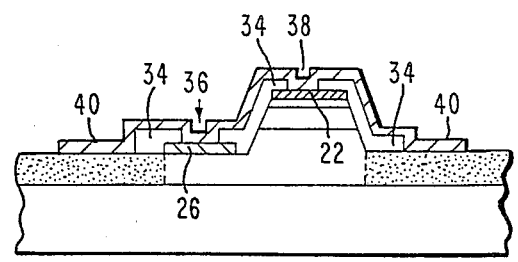

In the next step via holes 36 and 38 are etched through the insulator layer 34 to the P+ and N+ layer contacts 22 and 26, respectively, by wet etching or reactive ion etching dry processes, for example, see FIG. 1i. Portions of the insulator layer 34 extending beyond the extent of the diode region 32 may also be etched away. A metal layer 40 which may be composed of titanium, platinum and gold, for example, is deposited over the insulator layers 34 and into the via holes 36 and 38, thereby making ohmic contact to the N+ and P+ layer contacts 22 and 26. This metal layer 40 may be about 1000Å thick, for example.

Figure 1J:
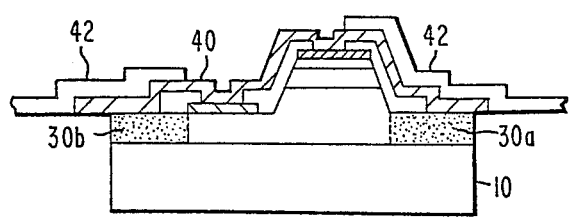

Thereafter, a metal pattern 42 is deposited over the metal contact layer 40 to connect the diode fabricated above to other semiconductor devices that may have been formed on the same substrate. Preferably, an alloy of titanium and gold is deposited to form the metal circuit pattern 42 as shown in FIG. 1j. The substrate is thereafter thinned to about 4 mils by lapping the back major surface 14 of substrate 10. If individual devices or electrical subassemblies composed of a number of semiconductor devices such as varactor and FETs have been formed on the substrate, they may be separated by sawing the substrate using a computer-controlled automation saw.

In some cases where the device will dissipate a lot of power, via holes (not shown) may be etched from the back side 14' of the thinned substrate through the proton bombardment regions 30a and 30b to the metallization 40. These via holes are filled with a metal from the back side of the substrate providing a contact means to the metallization and simultaneously providing a heat sink for the diode.

It will be appreciated that various modifications may be made to the fabrication process described above without departing from the spirit of the invention. Thus, although the present invention has been shown and described with reference to a particular embodiment, nevertheless various changes and modifications obvious to one skilled in the art are deemed to be within the spirit, scope and contemplation of the invention as set forth in the appended claims.

What is claimed is:

1. A method for manufacturing semiconductor structures having varactor profiles having deep N+ type conductivity layers including the steps of:
    providing a semi-insulating substrate of III-V semiconductor material having an essentially flat major surface;
    implanting first silicon ions through said major surface of said substrate at an energy level in the range of from about 5 to 7 MeV and of a dose of from about $1 \times 10^{14}$ to $1 \times 10^{15}$ ions/cm$^2$;
    implanting second silicon ions through said major surface of said substrate at an energy level less than the energy level of said first implanting step and in the range of from about 3 to 5 MeV and of a dose of from about $1 \times 10^{14}$ to $1 \times 10^{15}$ ions/cm$^2$;
    implanting sulfur ions through said major surface of said substrate at an energy level of from about 5 to 7 MeV and a dose of from about $1 \times 10^{14}$ to $1 \times 10^{15}$ ions/cm$^2$, thereby providing a deeply buried N+ type conductivity layer.

2. The method defined in claim 1 further including implanting silicon ions through said major surface of said substrate at an energy level of from about 350 to 500 Kev and doses of from about $6 \times 10^{12}$ to $1 \times 10^{13}$ ions/cm$^2$ to provide an N type conductivity layer adjacent said N+ type conductivity layer.

3. The method defined in claim 2 further including implanting P type ions through said major surface of said substrate at an energy level of from about 15 to 30 KeV and a dose of from about $5 \times 10^{14}$ to about $5 \times 10^{15}$ ions/cm$^2$ to provide a P+ type conductivity layer between said N type conductivity layer and said major surface.

4. The method defined in claim 3 further including annealing said substrate in a high purity gas at a predetermined elevated temperature and for a predetermined time sufficient to remove substantial amounts of ion implantation damage in said wafer and to electrically activate the N and P implants.

5. The method defined in claim 4 wherein said predetermined elevated temperature is in the range of from about 900–1050° C. and said predetermined time is from about 5 to 20 seconds.

6. The method defined in claim 5 wherein said predetermined elevated temperature and time are 950° C. and 10 seconds, respectively.

7. The method defined in claim 5 further including providing said substrate with contact metallization to said N+ type conductivity layer and to said P+ type conductivity layer.

8. The method defined in claim 5 further including etching away portions of said P+ type conductivity layer, N type conductivity layer and N+ type conductivity layer to form a mesa of semiconductor material composed of said P+, N and N+ type conductivity layers.

9. The method defined in claim 8 further including the step of depositing contact metallization to said N+ type conductivity layer and said P+ type conductivity layer in spaced relationship.

10. The method defined in claim 9 further including the step of depositing a layer of nonconductive material over said contact metallization and said mesa of semiconductor material.

11. A method for manufacturing semiconductor structures having varactor profiles, including the steps of:
    providing a semi-insulating semiconductor substrate having a flat major surface;
    performing at least three ion implantations through said flat major surface into said substrate to form a deeply buried N+ type conductivity layer including:
        implanting first silicon ions into said substrate at an energy level of from about 5 to 6 MeV and a dose of from about $1 \times 10^{14}$ to $1 \times 10^{15}$ ions/cm$^2$;
        implanting second silicon ions into said substrate at an energy level less than the energy level of said first implanting step and in the range of from about 3 to 5 MeV and a dose of from about $1 \times 10^{13}$ to $1 \times 10^{15}$ ions/cm$^2$;
        implanting sulfur ions into said substrate at an energy level of from about 5 to 7 Mev and a dose of from about $1 \times 10^{14}$ to $1 \times 10^{15}$ ions/cm$^2$;
    implanting third silicon ions through said major surface into said substrate at an energy level of from about 350 to 500 KeV and a dose of from about $6 \times 10^{12}$ to $1 \times 10^{13}$ ions/cm$^2$ to form an N type conductivity layer adjacent said N+ type conductivity layer;
    implanting beryllium ions through said major surface into said substrate at an energy level of from about 20–30 KeV and a dose of from about $5 \times 10^{14}$ to $5 \times 10^{15}$ ions/cm$^2$ to form a P+ type conductivity layer between said major surface and N type conductivity layer;
    annealing said substrate in a high purity atmosphere at a predetermined elevated temperature for a predetermined period of time sufficient to remove substantial amounts of ion implantation damage in said substrate.

12. The method defined in claim 11 wherein said first silicon ions are implanted at an energy level of about 6 MeV and a dose greater than about $1\times10^{14}$ ions/cm$^2$.

13. The method defined in claim 12 wherein said second silicon ions are implanted at an energy level of about 4 MeV and a dose greater than about $1\times10^{13}$ ions/cm$^2$.

14. The method defined in claim 13 wherein said sulfur ions are implanted at an energy level of about 6 MeV and a dose greater than about $1\times10^{14}$ ions/cm$^2$.

15. The method defined in claim 14 wherein said third silicon ions are implanted at an energy level of about 400 KeV and a dose greater than about $6\times10^{12}$ ions/cm$^2$.

16. The method defined in claim 11 wherein said predetermined elevated temperature is in the range from about 900 to 1050° C. and said predetermined time is from about 5 to 20 sec.

17. The method defined in claim 16 further including providing said substrate with contact metallization to said N+ type conductivity layer and said P+ type conductivity layer in spaced relationship.

* * * * *